(12) United States Patent
Shibutani et al.

(10) Patent No.: US 6,414,415 B1
(45) Date of Patent: Jul. 2, 2002

(54) SURFACE ACOUSTIC WAVE DEVICE AND METHOD FOR MANUFACTURING THE SAME

(75) Inventors: Makoto Shibutani, Shiga-ken; Toshiyuki Fuyutsume, Ishikawa-ken; Shingo Iwasa, Matto, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/483,142

(22) Filed: Jan. 13, 2000

(30) Foreign Application Priority Data

Feb. 18, 1999 (JP) ............................................. 11-039775
Mar. 12, 1999 (JP) ............................................. 11-067348

(51) Int. Cl.[7] .............................................. H01L 41/08
(52) U.S. Cl. .............................. 310/313 R; 310/313 B
(58) Field of Search ........................ 310/313 R, 313 B, 310/313 A, 313 C, 313 D

(56) References Cited

U.S. PATENT DOCUMENTS 4,371,231 A  2/1983  Jung ....................... 339/275 R
4,999,535 A  3/1991  Mariani et al.

FOREIGN PATENT DOCUMENTS

| EP | 897 215 A2 | 2/1999 |
| GB | 2 108 800 | 5/1983 |
| JP | 50-68058 | 6/1975 |
| JP | 51-17666 | 2/1976 |
| JP | 56-43816 | 4/1981 |
| JP | 56-83956 | 7/1981 |
| JP | 56-99926 | 12/1981 |
| JP | 59-232432 | 12/1984 |
| JP | 60-127813 | 7/1985 |
| JP | 61-172362 | 8/1986 |
| JP | 62-174934 | 7/1987 |
| JP | 3-285338 | 12/1991 |

*Primary Examiner*—Mark O. Budd
(74) *Attorney, Agent, or Firm*—Keating & Bennett, LLP

(57) ABSTRACT

A surface acoustic wave device includes a package having an element mounting surface, a surface acoustic wave element provided in the package and having at least one bonding electrode, an adhesive arranged such that the surface acoustic wave element is fixed to the element mounting surface of the package, and at least one bonding wire connected to the at least one bonding electrode. The at least one bonding electrode has at least one line-shaped through hole extending therethrough at a region where the at least one bonding wire is connected to the at least one bonding electrode.

13 Claims, 4 Drawing Sheets

SURFACE ACOUSTIC WAVE DEVICE AND METHOD FOR MANUFACTURING THE SAME

BACKGROUND OF THE INVENTION

1. Field of the Invention

The present invention relates to a surface acoustic wave device to be used for a surface acoustic wave resonator or a surface acoustic wave filter and a method for manufacturing the same, and more specifically, a surface acoustic wave device having a bonding electrode in which a bonding wire is bonded via a wire bonding method, and a method for manufacturing the same.

2. Description of the Related Art

In manufacturing a surface acoustic wave device, a structure to seal the surface acoustic wave element in a package is often used. (For example, refer to Japanese Unexamined Patent Publication Nos. 50-68058, 51-17666, 61-172362).

The following method has been used in assembling a surface acoustic wave device to store the surface acoustic wave element in the package. First, the surface acoustic wave element in which at least one interdigital transducer (hereinafter, referred to as IDT) and a bonding electrode to be electrically connected to the outside are provided on a surface acoustic wave substrate is prepared. This surface acoustic wave element is fixed on an element mounting surface of a package member using an adhesive so as to constitute the package. Then, a terminal electrode to be electrically connected to the outside of the package member is bonded to the bonding electrode of the surface acoustic wave element via a wire bonding method making use of ultrasonic oscillation. That is, the bonding wire is bonded to the bonding electrode while applying the ultrasonic oscillation, and the other end of the bonding wire is bonded to the terminal electrode provided on the package member by the wire bonding method similarly applying ultrasonic wave oscillation.

After the connection by the above-described bonding wire is completed, another package member arranged to seal the surface acoustic wave element is fixed to the package member to complete the surface acoustic wave device.

In constructing the surface acoustic wave device to store the surface acoustic wave element in the package, the surface acoustic wave element is fixed to the element mounting surface of the package member using adhesive. However, the abovedescribed adhesive is shrunk during the curing process, and stress is exerted in the surface acoustic wave element due to this shrinkage during curing. Thus, there has been a problem that the characteristics of the surface acoustic wave device vary due to the shrinkage during curing.

In particular, the stress due to the above-described cure shrinkage is also varied by the operation environment or atmospheric change, and thus, the surface acoustic wave device characteristics vary during usage and operation.

On the other hand, when a strain is generated in the package to which the surface acoustic wave element is fixed, the stress is exerted in the surface acoustic wave element through the above-described adhesive. When the above-described stress is exerted, the characteristic of the surface acoustic wave element is varied. That is, there has been a problem that the variance in the stress causes the variance in the characteristics of the surface acoustic wave device, and the yield of the surface acoustic wave device is consequently degraded.

SUMMARY OF THE INVENTION

To overcome the problems described above, preferred embodiments of the present invention provide a surface acoustic wave device and method of manufacturing the same, which minimizes the influence of stress exerted on the surface acoustic wave element by shrinkage during curing of the adhesive used to fix the surface acoustic wave element and the strain generated in the package, to thereby eliminate variations in device characteristics, and to achieve excellent bonding reliability of the bonding wire to the bonding electrode.

According to one preferred embodiment of the present invention, a surface acoustic wave device includes a package having an element mounting surface, a surface acoustic wave element provided in the package and having at least one bonding electrode, an adhesive arranged such that the surface acoustic wave element is fixed to the element mounting surface of the package, and at least one bonding wire connected to the at least one bonding electrode, in which the at least one bonding electrode has at least one line-shaped through hole extending therethrough at a region where the at least one bonding wire is connected to the at least one bonding electrode.

According to the surface acoustic wave device according this preferred embodiment, the surface acoustic wave element is fixed to the element mounting surface of the package through the soft adhesive layer, and the stress attributable to the cure shrinkage of the adhesive, the strain applied to the package, and other forces, are prevented from propagating to the surface acoustic wave element. Thus, the variations in the component characteristics are minimized, and the yield of the surface acoustic wave device are greatly improved.

The adhesive preferably has a Shore hardness of about 80 HSD or less in a cured state and may be one of modified epoxy resin adhesive and a silicone resin adhesive.

In addition, because the line-shaped through holes are formed in the above-described bonding electrodes, the oxide film on the surface of the bonding electrode is first removed by the sliding of the bonding wire at a peripheral edge portion of the through hole to start the bonding, and the bonded surface is extended in the direction of the ultrasonic oscillation when the bonding wire is bonded to the bonding electrode via the ultrasonic wire bonding method. Thus, the bonding strength and the bonding reliability of the bonding wire to the bonding electrode are greatly increased.

In addition, the through hole is line-shaped, the through hole can be easily formed through etching after the electrically conductive film is formed. Thus, the through hole can be easily formed without increasing the area of the through hole, and the bonding area of the bonding electrode is prevented from being reduced by forming the through hole. Because the area contributing to the bonding of the bonding electrode to the bonding wire is prevented from being reduced, the bonding strength and the bonding reliability of the bonding wire are also increased.

The line-shaped through hole may have a shape in which a plurality of line-shaped parts are combined. For example, the line-shaped through hole may have a zigzag shape or a cruciform shape.

In a case where a plurality of line-shaped parts are combined in the abovedescribed line-shaped through holes, the number of the edge portions from which the oxide film is first removed in the sliding direction of the bonding wire is increased compared with the case of the straight through hole, and thus, the bonding reliability of the bonding wire to the bonding electrode is further increased.

The method for manufacturing a surface acoustic wave device according to another preferred embodiment of the present invention preferably includes the steps of preparing a surface acoustic wave substrate, forming an electrically conductive film on the surface acoustic wave substrate, etching the electrically conductive film so that at least one interdigital transducer and a bonding electrode having a line-shaped through hole are formed, fixing the surface acoustic wave element to an element mounting surface of a package using an adhesive; and bonding a bonding wire to a bonding electrode of the surface acoustic wave element via ultrasonic wire bonding.

In the manufacturing method of a surface acoustic wave device of this preferred embodiment, at least one IDT and the bonding electrode having the line-shaped through hole are etched after the electrically conductive film is formed on the surface acoustic wave substrate. Thus, in the IDT forming process, the above-described line-shaped through hole can be simultaneously formed, and the surface acoustic wave device of the present invention can be easily provided without adding any extra process steps. Thus, the surface acoustic wave device of preferred embodiments of the present invention is achieved without increasing the time, expense and difficulty of the manufacturing process. A For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

The inventors of the present invention have discovered that the above-described stress exerted on a surface acoustic wave element can be minimized if a soft adhesive is used in fixing the surface acoustic wave element to an element mounting surface of a package. The soft adhesive has a flexibility when the adhesive is set. The soft adhesive preferably includes, for example, a modified epoxy resin adhesive, or a silicone resin adhesive. More specifically, it is preferable that the soft adhesive in a cured state has a Shore hardness of about 80 HSD or less defined by JIS (Japanese Industrial Standard) Z2246-1992.

By fixing the surface acoustic wave element to the element mounting surface of the package using the above-described soft adhesive, the stress due to the cure shrinkage is greatly reduced, and the propagation of the stress due to the strain applied to the package or to the surface acoustic wave element is minimized. Thus, the fluctuation in the characteristics of the surface acoustic wave device according to a preferred embodiment of the present invention is greatly reduced.

However, if the above-described soft adhesive is used, the ultrasonic energy is absorbed by the soft adhesive layer when the ultrasonic wave is applied during the wire bonding process.

There has been a problem that the bonding property between a bonding wire and a bonding electrode is degraded in conventional devices.

It was discovered that a through hole can be formed in the bonding electrode in order to improve the bonding property of the bonding wire to the bonding electrode. This is described referring to FIGS. 1A and 1B.

Figure 1A:
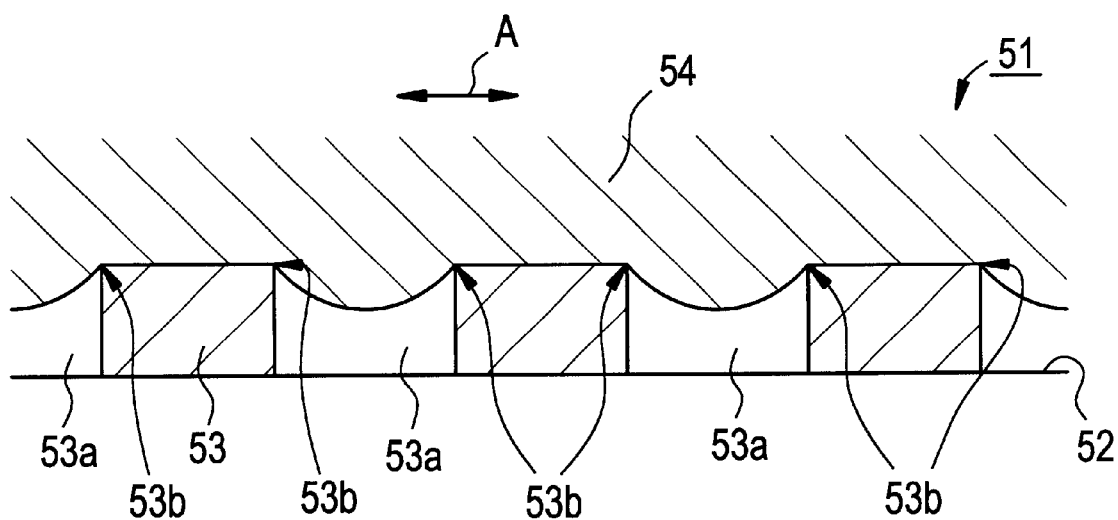
FIGS. 1A and 1B are schematic sectional views used for explaining the process of bonding a bonding wire to a bonding electrode in the surface acoustic wave device.
Figure 1B:
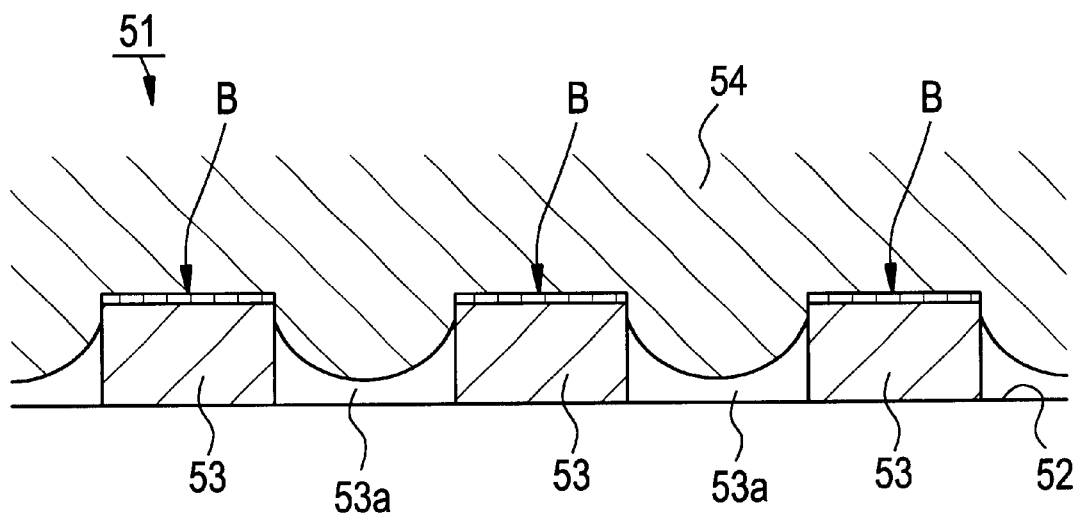

FIGS. 1A and 1B are sectional views used to describe a process for bonding the bonding wire to the bonding electrode having the through hole using ultrasonic waves according to preferred embodiments of the present invention.

As illustrated in FIG. 1A, a bonding electrode 53 is provided on a surface acoustic wave substrate 52 of a surface acoustic wave element 51. The bonding electrode 53 preferably has a plurality of through holes 53a. A bonding wire 54 is brought into contact with the bonding electrode 53, and the bonding wire 54 is bonded to the bonding electrode 53 by applying the ultrasonic wave.

In this case, as illustrated in FIG. 1A, when the ultrasonic wave is applied, the bonding wire 54 is oscillated, and as a result, the bonding wire 54 slides in the direction of the arrow A on the bonding electrode 53. The bonding electrode 53 generally includes a base metal such as Al. Thus, the surface of the bonding electrode 53 is covered with an oxide film.

To bond the bonding wire 54, it is necessary to remove the oxide film. In an ultrasonic wire bonding method, the ultrasonic oscillation is applied to the bonding wire 54, and the oxide film is removed by allowing the bonding wire 54 to slide on the bonding electrode 53 as described above, but when the surface acoustic wave element is fixed using the soft adhesive, the surface acoustic wave element is oscillated in a synchronous manner relative to the ultrasonic oscillation. As a result, the sliding between the bonding wire and the bonding electrode is not sufficient, and the oxide film can not be removed to a degree necessary for the bonding.

Figure 2:
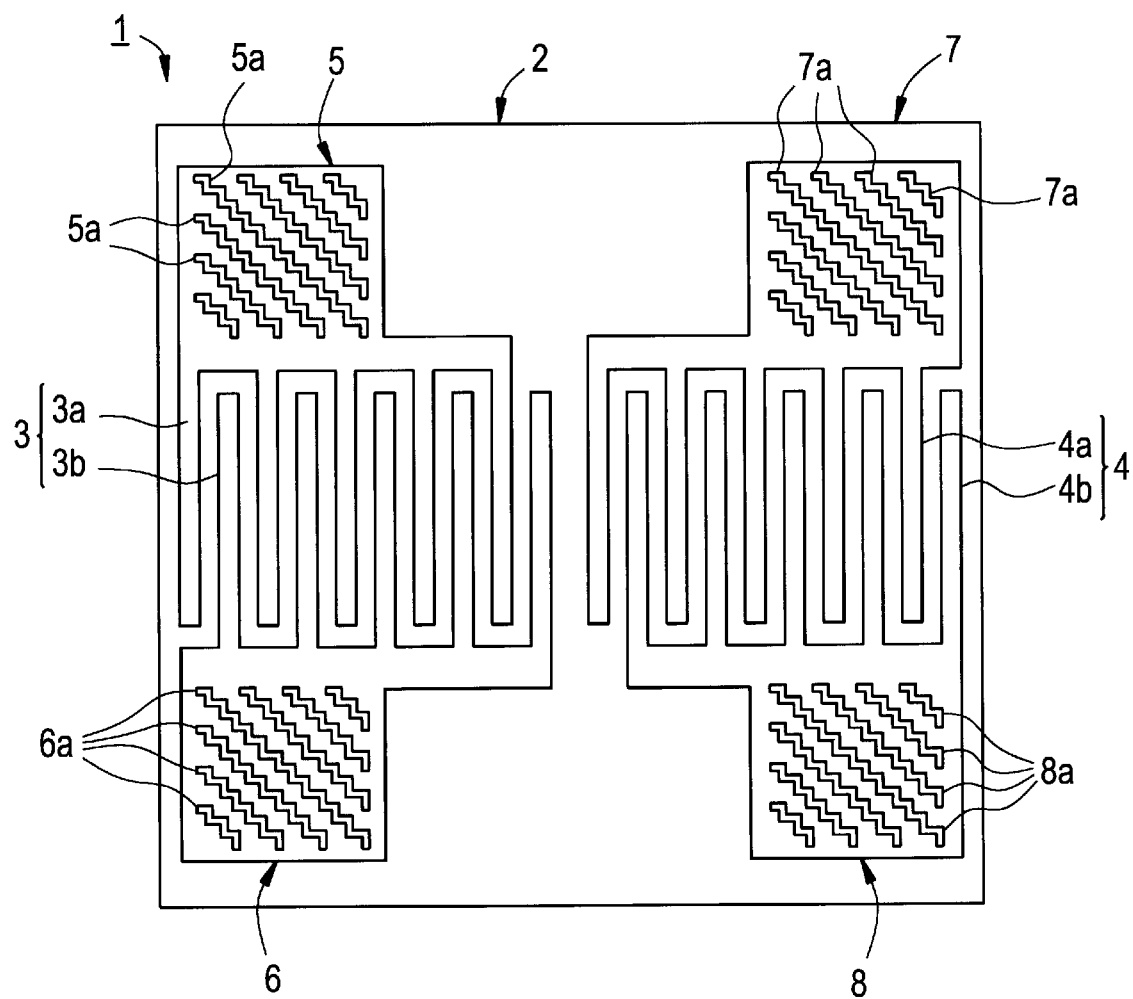
FIG. 2 is a plan view of a surface acoustic wave element to be used for a surface acoustic wave device according to one preferred embodiment of the present invention.

On the other hand, when the bonding electrode 53 has a through hole 53a formed therein and as illustrated in FIG. 2A, immediately after the wire bonding is started, a peripheral edge portion of the through hole 53a in the bonding electrode 53, that is, an edge portion 53b is easily deformed plastically by the slide of the bonding wire 54, and the oxide film is first broken at the edge portion. Thus, the bonding surface is extended in the direction of the ultrasonic oscillation with the edge portion as a base point, and as illustrated in FIG. 2B with a hatching B, the bonding wire 54 is surely bonded onto the bonding electrode 53 forming a large bonding surface.

That is, the bonding wire 54 can be excellently and securely bonded by forming the through hole in the bonding electrode 53.

Also, the above-described through hole 53a can be simultaneously formed during pattering of an IDT or the like through an etching process or other similar forming process, after a metallic film is formed on a surface acoustic wave substrate.

In the bonding electrode with the through hole 53a formed therein, the workability of the through hole 53a is inversely related to the area of the bonding electrode 53.

That is, when the through hole 53a is formed through etching, it is more difficult to surely form the through hole 53a as the hole becomes smaller.

On the other hand, if the area of the through hole 53a is large, the through hole 53a can be easily formed via etching, but the area of the bonding electrode 53 is greatly reduced. When the area of the bonding electrode 53 is reduced, a sufficient bonding area can not be ensured, and the bonding strength and the bonding reliability are degraded. In addition, the adhesion area of the surface acoustic wave substrate to the bonding electrode 53 is also reduced, and a problem occurs in that the adhesion strength of the surface acoustic wave substrate 52 to the bonding electrode 53 is decreased.

The inventors earnestly examined and considered structures which are capable of achieving the sufficient bonding strength of the bonding electrode to the bonding wire and easily forming the through hole in a surface acoustic wave device using the abovedescribed soft adhesive and the bonding electrode having the through hole, and as a result, achieved the present invention. That is, the present invention is characterized in that the workability of the through hole is greatly improved and the area of the bonding electrode is much larger and more than adequate by providing the above-described through hole having a line shape.

As explained above, the bonding surface between the bonding electrode and bonding wire is extended in the direction of the ultrasonic oscillation with the edge portion of the through hole as a starting point. Therefore, it is preferable that one through hole provides many edge portions in the direction of ultrasonic oscillation or that a plurality of through holes are provided on the bonding electrode in the direction of ultrasonic oscillation so that the bonding wire is bonded to the bonding electrode firmly and quickly. In addition, it is advantageous that bonding between the bonding electrode and bonding wire is performed regardless of the direction of ultrasonic oscillation. For example, the through hole preferably has a line shape pattern defining a zigzag configuration, or a plurality of line-shaped through holes are provided in different directions on the bonding electrode.

The dimension of the through hole to be provided on the bonding electrode is not limited to a particular length or width. However, it is preferable the width of the through hole is within the range of about 0.2 $\mu$m to about 20 $\mu$m.

FIGS. 1A and 1B are plan views of the surface acoustic wave element used in the surface acoustic wave device of a first preferred embodiment of the present invention.

A surface acoustic wave element 1 preferably includes a substantially rectangular surface acoustic wave substrate 2. The surface acoustic wave substrate 2 can be constituted by a piezoelectric substrate using, for example, a piezoelectric ceramic such as lead titanate zirconate ceramic, or piezoelectric single crystal such as $LiNbO_3$, $LiTaO_3$ or quartz. Alternatively, the surface acoustic wave substrate 2 may include a piezoelectric thin film such as ZnO on an insulation substrate such as alumina.

In this preferred embodiment, two IDTs 3, 4 are disposed on an upper surface of the surface acoustic wave substrate 2 to constitute a surface acoustic wave filter. The IDTs 3, 4 are provided with a pair of comb-shaped electrodes 3a, 3b, 4a, 4b, respectively. In the IDT 3, electrode fingers of the comb-shaped electrode 3a and electrode fingers of the comb-shaped electrode 3b are arranged so as to be interdigitated with each other. Similarly, in the IDT 4, electrode fingers of the comb-shaped electrode 4a and electrode fingers of the comb-shaped electrode 4b are arranged so as to be interdigitated with in each other.

Bonding electrodes 5 are continuously formed on the comb-shaped electrode 3a. Similarly, bonding electrodes 6–8 are continuously formed on the comb-shaped electrodes 3b, 4a, 4b, respectively.

The bonding electrodes 5–8 are arranged to electrically connect the surface acoustic wave element 1 to external components, and to drive the surface acoustic wave element 1.

A plurality of line-shaped through holes 5a–8a are disposed on the bonding electrodes 5–8. In the present preferred embodiment, the line-shaped through hole 5a preferably has a zigzag configuration extending in the diagonal direction and in the direction parallel to the diagonal direction in the substantially rectangular bonding electrodes 5–8.

However, as described below, the shape of the line-shaped through holes 5a–8a is not limited thereto and may have other shapes.

The IDTs 3, 4 and the bonding electrodes 5–8 can be formed by preparing the surface acoustic wave substrate 2, forming an electrically conductive film formed of Al or the like on the surface acoustic wave substrate 2, and then, etching the electrically conductive film. That is, the through holes 5a–8a can be simultaneously formed with the bonding electrodes 5–8 and the IDTs 3, 4 without adding manufacturing processing steps.

Figure 3:
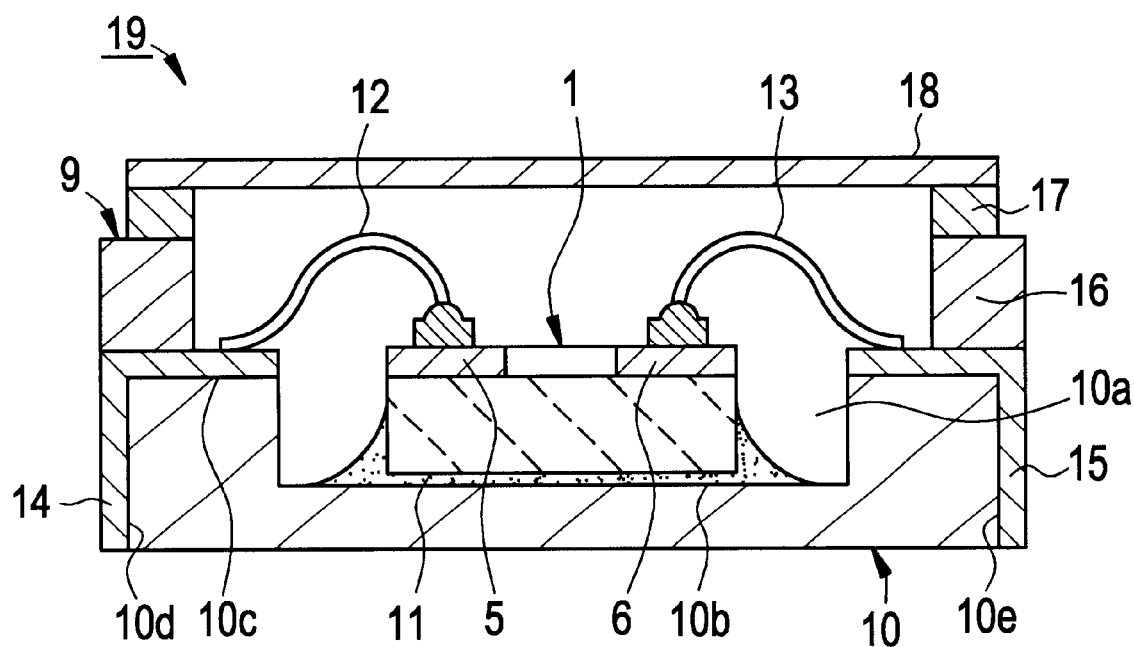
FIG. 3 is a sectional view of the surface acoustic wave device according to one preferred embodiment of the present invention.

In the manufacturing method of the surface acoustic wave device of the present preferred embodiment, the surface acoustic wave element 1 obtained as described above is stored in a package 9 illustrated in FIG. 3. The package 9 is provided with a recessed portion 10a in its upper surface, and provided with a first package member 10 having frame-shaped spacers 16, 17 laminated around the recessed portion 10a. A bottom surface of the recessed portion 10a of the package member 10 constitutes an element mounting surface 10b. The above-described surface acoustic wave element 1 is fixed on this element mounting surface 10b through a soft adhesive layer 11. The adhesive defining the soft adhesive layer 11 preferably includes the above-described modified epoxy resin adhesive, silicone resin adhesive, or other suitable material. Because the soft adhesive layer 11 is constituted using the adhesive mainly including the above-described soft resin, the shrinkage stress during the curing of the adhesive is absorbed by the soft adhesive layer 11 itself, and the stress resulting from the curing shrinkage is prevented from being applied to the surface acoustic wave element 1. In addition, because the strain is absorbed by the soft adhesive layer 11 even when the strain is added to the package member 10, the propagation of the stress attributable to the above-described strain applied to the surface acoustic wave element 1 is minimized even when the strain is applied not only to the package 10, but also to other areas and portions of the package. Thus, a surface acoustic wave device having almost no variations in component characteristics is achieved.

After the surface acoustic wave element 1 is fixed using the soft adhesive layer 11, the surface acoustic wave element 1 is bonded to the terminal electrode on the package member 10.

In FIG. 3, only the bonding electrodes 5, 6 of the bonding electrodes 5–8 are schematically illustrated. Here, the bonding electrodes 5, 6 are bonded to terminal electrodes 14, 15 provided on the package member 10 via bonding wires 12, 13. The terminal electrodes 14, 15 are formed of an appropriate electrically conductive material such as aluminum, and are arranged to extend to outside surfaces 10d, 10e from an upper surface 10c of the package member 10.

In the bonding using the wire bonding method, the bonding is achieved by bringing each end of the bonding wires 12, 13 into contact with the bonding electrodes 5, 6, and applying ultrasonic oscillation thereto. In this case, the above-described line-shaped through holes 5a, 6a illustrated in FIG. 1 are formed in the bonding electrodes 5, 6 though they are not shown in FIG. 3. Thus, similar to a case of the wire bonding process illustrated in FIG. 2, oxide films of the bonding electrodes 5, 6 are removed with an edge portion of peripheral edges of the line-shaped through holes 5a, 6a as starting points, the bonding wires 12, 13 are bonded to the bonding electrodes 5, 6, and a bonded surface is extended in the direction of the ultrasonic oscillation. Thus, the bonding wires 12, 13 are securely and reliably bonded to the bonding electrodes 5, 6.

On the other hand, the other end portions of the bonding wires 12, 13 are similarly bonded to the terminal electrodes 14, 15 via the ultrasonic wire bonding method. The above-described through hole, preferably a line-shaped through hole, may also be formed in the terminal electrodes 14, 15. As a result, the bonding reliability of the terminal electrodes 14, 15 to the bonding wires 12, 13 is greatly approved improved.

Further, the bonding electrodes 7, 8 are similarly bonded to the other terminal electrodes (not shown) using bonding wires not shown in the figure.

After bonding via the bonding wires 12, 13 is completed, a lid 18 is fixed to an upper surface of a spacer 17 to cover an upper opening of the package member 10. A surface acoustic wave device 19 is thus completed.

In the surface acoustic wave device 19, a second package member in preferred embodiments of the present invention is constituted by the above-described lid 18, and the surface acoustic wave element 1 is sealed inside the package 9 by fixing the second package member to the first package member 10.

Further, because the terminal electrodes 14, 15 are led to an outer surface of this package 9, i.e., side surfaces 10d, 10e of the first package member 10, the package can be electrically connected to external components using the terminal electrodes 14, 15, and the surface acoustic wave element 1 inside can be driven.

As described above, in the present preferred embodiment, the surface acoustic wave element 1 is fixed to the package member 10 using the soft adhesive layer 11, and the surface acoustic wave device 19 has almost no variation in component characteristics. In addition, the line-shaped through holes 5a–8a are formed in the bonding electrodes 5–8, and thus, the bonding reliability of the bonding wires 12, 13 to the bonding electrodes 5, 6 is greatly improved.

In addition, the above-described line-shaped through holes 5a–8a preferably have a line-shape configuration, and the through holes 5a–8a can be easily formed during etching of the above-described electrically conductive film compared with a case of forming a circular through hole of small diameter. That is, the line-shaped through holes 5a–8a can be easily and accurately formed making use of the fluidity of an etchant during an etching process.

Thus, the through holes 5a–8a can be easily formed even when the area of the through holes 5a–8a is not increased so much, the bonding area of the bonding electrodes 5–8 to the bonding wires is not reduced. Thus, sufficient bonding area of the bonding electrodes 5a–8a to the bonding wires 12, 13 is reliably provided, and the bonding strength and the bonding reliability of the bonding wires 12, 13 to the bonding electrodes 5–8 is greatly improved.

Figure 4A:
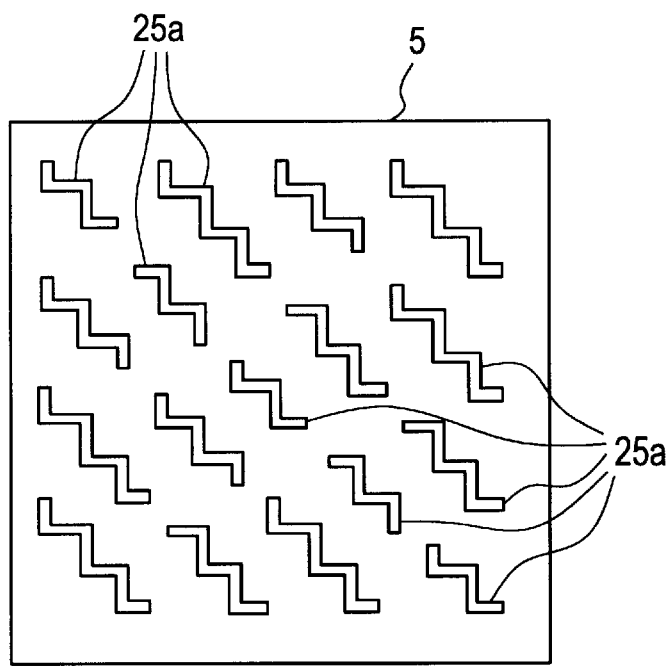
FIGS. 4A and 4B are plan views for explaining a modification of a line-shaped through hole.

In the above-described preferred embodiment, the zigzag-shaped through holes extending in the diagonal direction and a plurality of zigzag-shaped through holes extending substantially parallel to the through holes define the line-shaped through holes 5a–8a, but each through hole can be of appropriate shape so long as it has a line-shaped part. For example, the line-shaped through hole may be curved. Further, as illustrated in FIG. 4A, the through hole 5a is partially divided so that a plurality of zigzag through holes 25a, 25a having a shape that is continuous in the diagonal direction and the direction substantially parallel to the diagonal direction.

Figure 4B:
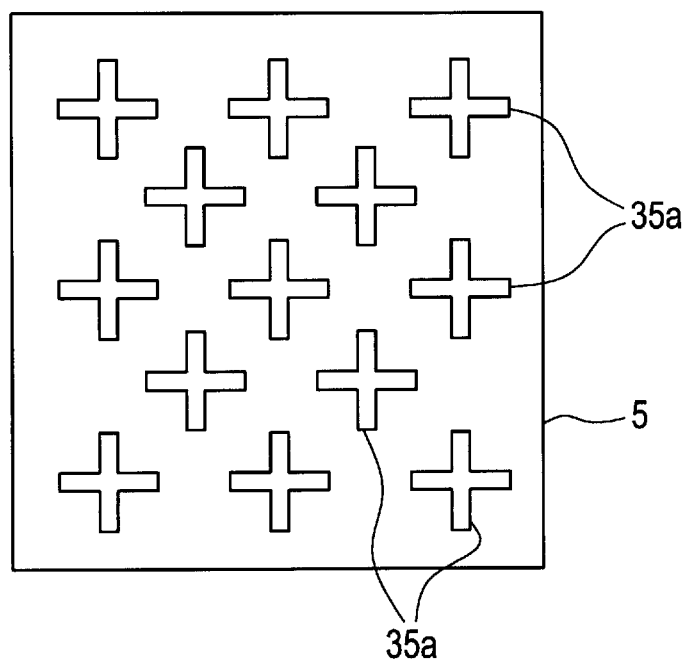

Further, like a through hole 35a indicated in FIG. 4B, a through hole of cruciform shape may also be used.

That is, a shape in which a plurality of straight portions are intersected with each other in the middle, or a shape in which a plurality of straight portions are continuously arranged with an angle provided at their end portions, is acceptable.

That is, a plurality of line-shaped through holes may have combined shapes so that a plurality of line-shaped portions are combined as described above. In any case, the fluidity of the etchant used in the etching process is improved compared with that for a through hole having a substantially circular section, the through hole can be easily formed without increasing the opening area by through holes, and the bonding reliability of the bonding electrode to the bonding wire is greatly improved.

In the above-described preferred embodiment, the surface acoustic wave filter having two IDTs 3, 4 is introduced as the surface acoustic wave element 1, but a surface acoustic wave filter having another structure, and appropriate surface acoustic wave elements such as a surface acoustic wave resonator and a surface acoustic wave delay line can be used for the surface acoustic wave element in preferred embodiments of the present invention.

Further, the structure of the package is not limited to the structure illustrated in the figure, and for example, the package member 10 may be formed of a flat package member having no recessed portion 10a.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a package having an element mounting surface;
   a surface acoustic wave element provided in the package and having at least one bonding electrode;
   an adhesive arranged such that the surface acoustic wave element is fixed to the element mounting surface of the package; and
   at least one bonding wire connected to the at least one bonding electrode; wherein
   the at least one bonding electrode has at least one line-shaped through hole extending therethrough at a region where the at least one bonding wire is connected to the at least one bonding electrode.

2. A surface acoustic wave device according to claim 1, wherein the adhesive has a Shore hardness of about 80 HSD or less in a cured state.

3. A surface acoustic wave device according to claim 2, wherein the adhesive is one of a modified epoxy resin adhesive and a silicone resin adhesive.

4. A surface acoustic wave device according to claim 1, wherein the line-shaped through hole has a shaped defined by a plurality of combined line-shaped portions.

5. A surface acoustic wave device according to claim 4, wherein the line-shaped through hole has a zigzag shape.

6. A surface acoustic wave device according to claim 4, wherein the line-shaped through hole has a cruciform shape.

7. A surface acoustic wave device according to claim 1, wherein the at least one bonding electrode has a plurality of through holes formed therein.

8. A surface acoustic wave device according to claim 1, wherein the at least one through hole includes a plurality of edge portions.

9. A surface acoustic wave device according to claim 1, wherein the width of the through hole is within the range of about 0.2 µm to about 20 µm.

10. A surface acoustic wave device according to claim 1, wherein the line-shaped through hole has a zigzag configuration extending in a diagonal direction and in a direction substantially parallel to the diagonal direction in the at least one bonding electrode.

11. A surface acoustic wave device according to claim 1, wherein the package is provided with a recessed portion in an upper surface thereof.

12. A surface acoustic wave device according to claim 11, wherein the package includes a first package member having frame-shaped spacers laminated around the recessed portion.

13. A surface acoustic wave device according to claim 11, wherein a bottom surface of the recessed portion of the package member defines the element mounting surface.

* * * * *